US006983012B1

(12) United States Patent
Shen

(10) Patent No.: US 6,983,012 B1
(45) Date of Patent: Jan. 3, 2006

(54) IMPLEMENTATION OF DIGITAL FILTER WITH REDUCED HARDWARE

(75) Inventor: Jiang Shen, Anhui (CN)

(73) Assignee: Golden Bridge Technology Incorporated, Long Branch, NJ (US)

( * ) Notice: Subject to any disclaimer, the term of this patent is extended or adjusted under 35 U.S.C. 154(b) by 770 days.

(21) Appl. No.: 09/912,452

(22) Filed: Jul. 26, 2001

Related U.S. Application Data

(60) Provisional application No. 60/222,666, filed on Aug. 3, 2000.

(51) Int. Cl.
*H03H 7/30* (2006.01)
*H04B 1/10* (2006.01)
*G06F 17/10* (2006.01)

(52) U.S. Cl. ....................... 375/229; 375/350; 708/319

(58) Field of Classification Search ................ 375/229, 375/350, 200; 708/300, 320, 319
See application file for complete search history.

(56) References Cited

U.S. PATENT DOCUMENTS 5,717,726 A * 2/1998 Herrmann et al. .......... 375/350
5,784,419 A 7/1998 LaRosa et al.
5,825,809 A * 10/1998 Sim ........................... 375/350
6,078,573 A * 6/2000 Batalama et al. ........... 370/335
6,112,218 A * 8/2000 Gandhi et al. .............. 708/320
6,169,759 B1 1/2001 Kanterakis et al.
6,363,262 B1 * 3/2002 McNicol ..................... 455/561
6,411,976 B1 * 6/2002 Cesari et al. ............... 708/319

* cited by examiner

*Primary Examiner*—Stephen Chin
*Assistant Examiner*—Cicely Ware
(74) *Attorney, Agent, or Firm*—McDermott Will & Emery LLP

(57) ABSTRACT

A digital filter function requires many coefficient multiplications. Instead of implementing the multiplications individually as multipliers, they may be implemented using traverse or shift operations. This approach uses the relation among the coefficients of the digital filter to reduce required hardware. A disclosed digital filter uses scalers and sample combiners for processing samples of a digital input stream. Each scaler scales a respective input sample from one of the combiners, preferably by a different power of 2. The combining circuits combine sets of samples, from the digital input stream and from the digital output of the filter, to form the input samples for processing by the scalers. An adder totals the respective scaled values, to form the digital output stream of the filter. The digital filter may be used in a variety of digital signal processing applications, but is particularly useful in low-power portable devices, such as wireless spread-spectrum receivers.

12 Claims, 4 Drawing Sheets

IMPLEMENTATION OF DIGITAL FILTER WITH REDUCED HARDWARE

RELATED APPLICATION

This application claims the benefit of U.S. Provisional Application No. 60/222,666, entitled "The Method of Implementation of Digital Filter with Reduced Hardware" filed on Aug. 3, 2000, the disclosure of which is entirely incorporated herein by reference.

FIELD OF THE INVENTION

The concepts involved in the present invention relate to techniques for building complex digital filters, preferably without the use of multipliers and with less hardware.

BACKGROUND

As is well known in the art, digital signal processing is now commonly used in many electronic systems, over a wide range of applications. Digital signal processing is utilized in video and audio signal processing, such as used in image recognition, image processing, data compression, digital audio and digital video recording and playback, and the like. Digital signal processing techniques are particularly commonplace in telecommunication applications.

Within the field of telecommunications, mobile communications are becoming particularly popular. The recent revolution in digital processing has enabled a rapid migration of mobile wireless services to digital communications, such as cellular telephone services provided via code division, multiple access (CDMA) technology. Increasingly, development efforts are focusing on techniques for high-capacity communication of digital information over wireless links, and much of this broadband wireless development work incorporates spread-spectrum communications similar to those used in CDMA.

Digital signal processing, including the processing for spread-spectrum wireless communications makes considerable use of digital filters. Digital filtering involves processing of sampled-data, or discrete-time, signals in accordance with a filtering algorithm. Stated another way, a digital filter utilizes a computational process, carried out either through dedicated hardware or through the execution of a sequence of instructions by programmable logic, by way of which an input sequence of numbers representing discrete signal samples is converted into an output sequence of numbers, modified by the transfer function of the desired filter.

For example, U.S. Pat. No. 6,112,218 to Gandhi et al. discloses a digital filter in which addition operations are interleaved among first and second output sample values, so that the resulting addition may be carried out with adder circuitry of the same precision as the signal input and the signal output.

In present day communication devices, digital filters are favored for their ease of implementation, efficient operation and good performance. Such filters can be built using off the shelf components such as digital signal processors (DSPs), custom designed using digital logic elements or implemented using read only memory (ROM) based table look-up techniques. Many functions may be implemented using such digital filters. In a wireless receiver, for example in a base station or a remote/mobile terminal device, such filters may be used for filtering received signals before further processing to recover transmitted data.

For example, U.S. Pat. No. 5,784,419 to LaRosa et al. discloses a digital filter, suitable for use in a CDMA communication device, which uses coefficient precombing. The digital filter includes a coefficient storage circuit, for storing the precombined coefficients, and a selection circuit for selecting appropriate precombined coefficients in response to the input signal. A circuit combines the appropriate coefficients, to produce a filtered signal.

The transfer function of any digital filter, including any digital filter used in wireless communications, can be written in the following form:

$$y(n) = \sum_{l=1}^{M} a_l \cdot y(n-i) + \sum_{l=0}^{N} b_l \cdot x(n-i) \quad (1)$$

Such a filter function can be implemented by canonical form, for example by the hardware illustrated in FIG. 1. The illustrated filter 10 includes a section 11, for processing of the digitized samples of the input signal x. As shown, the input signal x(n) is applied to a first multi-tap delay line formed of delay elements $\mathbf{13}_1$ to $\mathbf{13}_N$. Each delay element 13 provides a delay of one clock interval $Z^{-1}$, which typically corresponds to the inter-symbol time period for the wireless digital communication system. The section 11 includes a number N+1 of multipliers 15, shown as multipliers $\mathbf{15}_0$ to $\mathbf{15}_N$. Stated another way, the filter section 11 includes one such multiplier $\mathbf{15}_0$ to $\mathbf{15}_N$ for receiving each of the N+1 input samples, from the x(n) input and from the N taps between and after the delays $\mathbf{13}_1$ to $\mathbf{13}_N$ of the delay line.

Each multiplier 15 multiplies the respective sample from the input or the delay line by a corresponding coefficient value b. Hence, the multipliers $\mathbf{15}_0$ to $\mathbf{15}_N$ multiply the sample values for x(n) to x(n−N) by the respective coefficient values $b_0$ to $b_N$. A series of adders $\mathbf{17}_1$ to $\mathbf{17}_N$ accumulate the outputs of the multipliers $\mathbf{15}_0$ to $\mathbf{15}_N$. Stated another way, the adders accumulate the total of the products from the mutiplications of the sample values times the first set of coefficients, over time intervals 0 to N.

The adder $\mathbf{17}_N$ also adds the feedback signal from a second section 19, of the digital filter 10, to form the overall filter output y(n). In a wireless spread-spectrum receiver, for example, the adder $\mathbf{17}_N$ supplies the accumulated output value to circuitry of the digital demodulator, for further processing.

The second section 19 of the digital filter 10 processes the digitized samples of the output signal y. As shown, the output signal y(n) is applied to a second multi-tap delay line formed of delay elements $\mathbf{21}_1$ to $\mathbf{21}_M$. Each delay element 21 provides a delay of one interval $Z^{-1}$. The section 19 includes a number M of multipliers 23, shown as multipliers $\mathbf{23}_1$ to $\mathbf{23}_M$. Stated another way, the second filter section 19 includes one such multiplier $\mathbf{23}_1$ to $\mathbf{23}_M$ for receiving each of the delayed output samples y and the M taps between and the delays $\mathbf{21}_1$ to $\mathbf{21}_M$ of the second delay line. In many applications, M will equal N+1.

Each multiplier 23 multiplies the respective sample from the delayed output by a corresponding coefficient value a. Hence, the multipliers $\mathbf{23}_1$ to $\mathbf{23}_M$ multiply the output sample values for y(n−1) to y(n−M) by the respective coefficient values $a_1$ to $a_M$. A series of adders 25 accumulate the outputs of the multipliers 23. Stated another way, the adders accumulate the total of the products from the mutiplications of the delayed output sample values times the second set of coefficients, over time intervals 1 to M. The series of adders

25 supply this total as the feedback signal to the adder $17_N$, to produce the overall filter output y(n).

As shown by the exemplary hardware diagram of FIG. 1, the filter function expressed in Equation (1) requires a large number of multiplications. If implemented in a digital signal processor, this requires a large number (N+M) of multiplications during each clock cycle. If implemented in hardware, the N+M multipliers require a large number of gates and consume a large amount of power.

For example, current proposals for the digital filter in fourth generation wireless systems may require 60 or more multiplications every clock cycle. With a DSP implementation, such a performance level is difficult to achieve at both the desired processing speed and reasonable cost and power dissipation levels for wireless applications, particularly for applications in portable wireless equipment. A hardware implementation can achieve the performance, but such an implementation requires an excessive number of gates and consumes an excessive amount of power, which reduces the time before recharging the battery of the portable equipment.

For wireless communications and other applications there is a need for digital filters that can be implemented with a minimum number of multiplication operations, so as to reduce complexity of operation, to reduce the amount of necessary hardware and to reduce power consumption. Hence, there is a continuing need for a digital filter methodology which implements a filter function that can achieve computations equivalent to a substantial number of multiply operations but without using actual multiplications.

SUMMARY OF THE INVENTION

Hence a general objective of the invention is to reduce the complexity of a digital filter, for example, in such a filter designed for use in a spread spectrum receiver.

A more specific objective relates to reducing and preferably eliminating the number of numerical multiplications and/or the number of circuits needed to implement such multiplications in a digital filter.

The inventive concepts alleviate the above noted problems in digital filter techniques and achieve the stated objectives by implementing the digital filter transversely, sharing as many common terms as possible and using scaling functions, e.g., scaling by predetermined powers of 2 (binary), which eliminates the need for multiplications.

Hence, one aspect of the present teachings relate to a method of digital filtering of a digitized input stream in accordance with an intended filter function. The intended filter function may be approximated as: a sum of products of a series of one or more first coefficient values and a series of one or more samples from a digital output stream; added together with a sum of products of a series of one or more second coefficient values and a series comprising a one or more samples from the digital input stream. The method involves combining predetermined sets of one or more samples from the digital input stream with one or more samples from a digital output stream, to form a plurality of respective numeric input values. Each respective numeric input value is scaled, by a different power of the base numeric value used for the digital filtering. In a digital filter implemented in binary form, each scaling involves shifting the respective input value so as to modify the input value as if it were multiplied by an appropriate power of two. The scaling, however, can be implemented as a simple shift function, without using a numeric (e.g. fixed-point) multiplication operation. The resulting scaled values are added together, to form a digital output stream in accordance with the predetermined filter function.

Other aspects of the invention relate to embodiments of digital devices that utilize the inventive digital filtering technique. The devices may utilize digital signal processors, but in the presently preferred embodiments, the digital filters are implemented in hardware. In such an implementation, for example, the inventive digital filtering technique eliminates the need for numeric multipliers, e.g. for performing fixed-point multiplications. This substantially reduces the hardware (number of gates) and the power consumption of the digital filter.

Hence, another specific aspect of the invention relates to a digital filter, for processing samples of a digital input stream without numeric multiplication. The digital filter comprises a plurality of scalers. Each scaler is for scaling a respective input sample by a different power of a base numeric value, e.g. by a different power of 2, to form a respective scaled value. The digital filter also includes a plurality of combining circuits. Each of these circuits is for combining a predetermined set of samples, from the digital input stream and from a digital output stream of the digital filter. Each combining circuit thereby forms a respective one of the input samples, for input to one of the scalers. The digital filter also includes an accumulator coupled to outputs of the scalers. The accumulator totals the respective scaled values, to form the digital output stream of the digital filter, without the need for any numeric multiplication. The digital filter exhibits a predetermined filter function, which approximates: the sum of products of a one series coefficient values and samples from the digital output stream; added together with a sum of products of another series of coefficient values and samples from the digital input stream.

The inventive digital filter design, with reduced complexity, may be used in a wide variety of applications. The inventive filter is particularly advantageous when used in battery-powered portable devices, such as digital wireless communication devices, because the filter requires a smaller number of gates and consumes considerably less power. Hence, other aspects of the invention relate to devices that incorporate the inventive digital filter. One such device is a wireless spread-spectrum receiver.

Additional objects, advantages and novel features of the invention will be set forth in part in the description which follows, and in part will become apparent to those skilled in the art upon examination of the following and the accompanying drawings or may be learned by practice of the invention. The objects and advantages of the invention may be realized and attained by means of the instrumentalities and combinations particularly pointed out in the appended claims.

BRIEF DESCRIPTION OF THE DRAWINGS

The drawing figures depict preferred embodiments of the present invention by way of example, not by way of limitations. In the figures, like reference numerals refer to the same or similar elements.

DETAILED DESCRIPTION OF THE PREFERRED EMBODIMENTS

Figure 1:
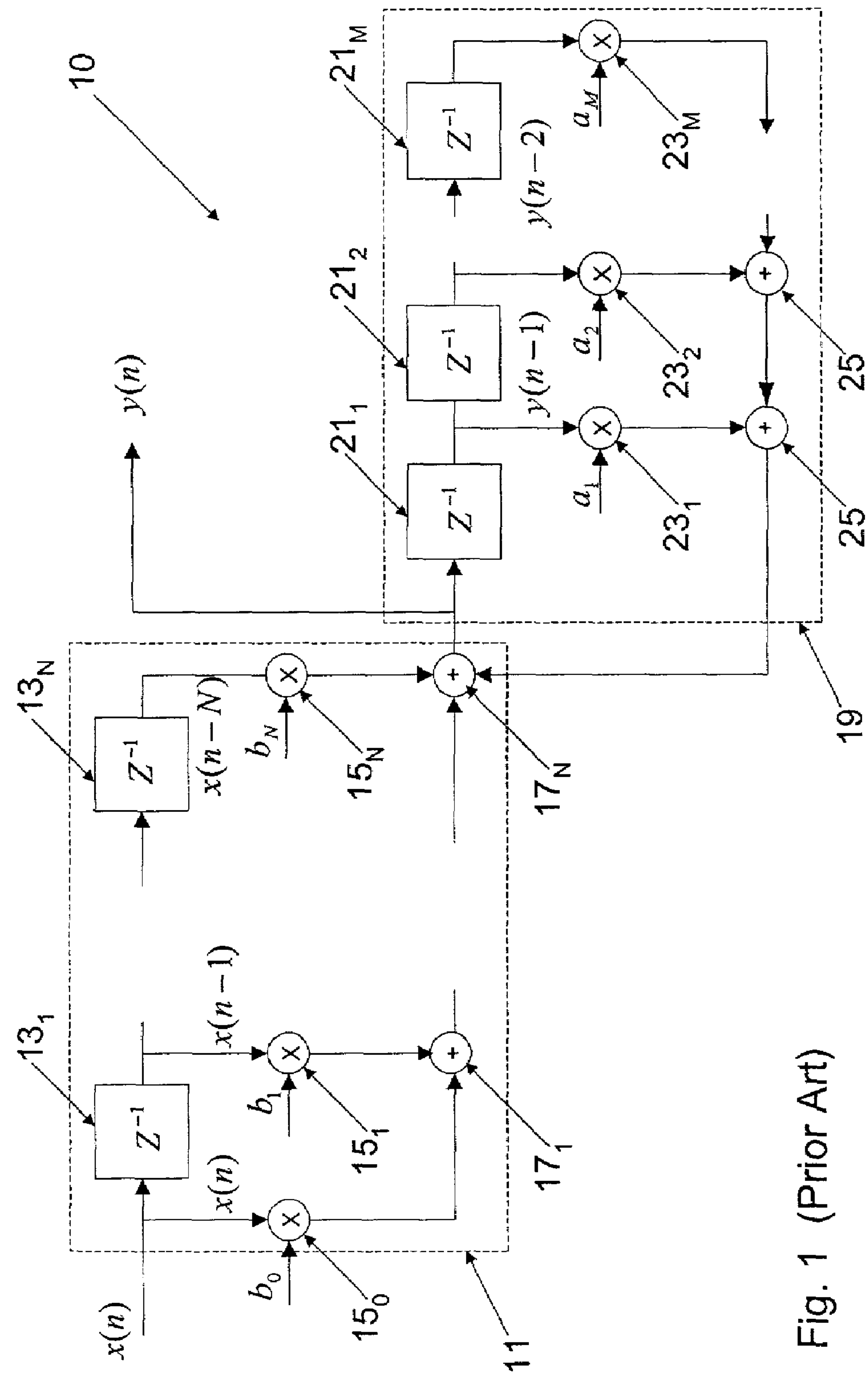
FIG. 1 is a functional block diagram of a hardware implementation of a conventional digital filter.

The present invention relates to an implementation of a digital filter, using selective combining of sample values and scaling of the combined values, to eliminate numeric multiplications, which otherwise might require fixed-point digital multiplications.

To appreciate the invention, and how it operates, it may be helpful to first consider the transfer function of a digital filter. As noted above, a digital filter function can be written in the following form:

$$y(n) = \sum_{i=1}^{M} a_i \cdot y(n-i) + \sum_{i=0}^{N} b_i \cdot x(n-i) \qquad (1)$$

In a fixed-point implementation of the digital filter, the coefficient values of $a_i$ and $b_i$ must be in or be converted approximately into the form of:

$$\sum_{j=L_1}^{L_2} c_j 2^j \qquad (2)$$

wherein $L_1$ and $L_2$ are two integers, such that:

$$2^{L_2} \geqq a_1 \geqq 2^{L_1}, \text{ for } i=1, \ldots, M$$

$$2^{L_2} \geqq b_1 \geqq 2^{L_1}, \text{ for } i=1, \ldots, N \qquad (3)$$

In the equation (2), $c_j$=0 or 1, that is to say a binary 1 or 0 value. Hence, it is possible to eliminate the use of multipliers by using the 0 or 1 binary value and scaling by appropriate powers of 2. With this inventive approach, $a_i$ and $b_i$ can be expressed in the form of:

$$a_i = \sum_{j=L_1}^{L_2} a_i^{[j]} \cdot 2^j \qquad (4)$$

$$b_i = \sum_{j=L_1}^{L_2} b_i^{[j]} \cdot 2^j \qquad (5)$$

wherein $a_i^{[j]}$ and $b_i^{[j]}$ are 1 or 0 (binary).

With these notations, we can substitute the summation values (Equations (4) and (5)) for $a_i$ and $b_i$ values and regroup the common scaling factors and summations, so to as to rewrite the digital filter function y(n) from Equation (1) into the form:

$$y(n) = \sum_{j=L_1}^{L_2} \left( \sum_{i=1}^{M} a_i^{(j)} \cdot y(n-i) + \sum_{i=0}^{N} b_i^{[j]} \cdot x(n-i) \right) \cdot 2^j \qquad (6)$$

With this form of the filter function, it is then possible to use an appropriate set of scalers, implemented as shift registers for shifting values by the appropriate number of bits positions, for each of the values of j from $L_1$ to $L_2$, rather than using actual multipliers. For each value j, the scaler shifts the binary sum of the components within the parenthesis a number of places equal to j.

Figure 2:
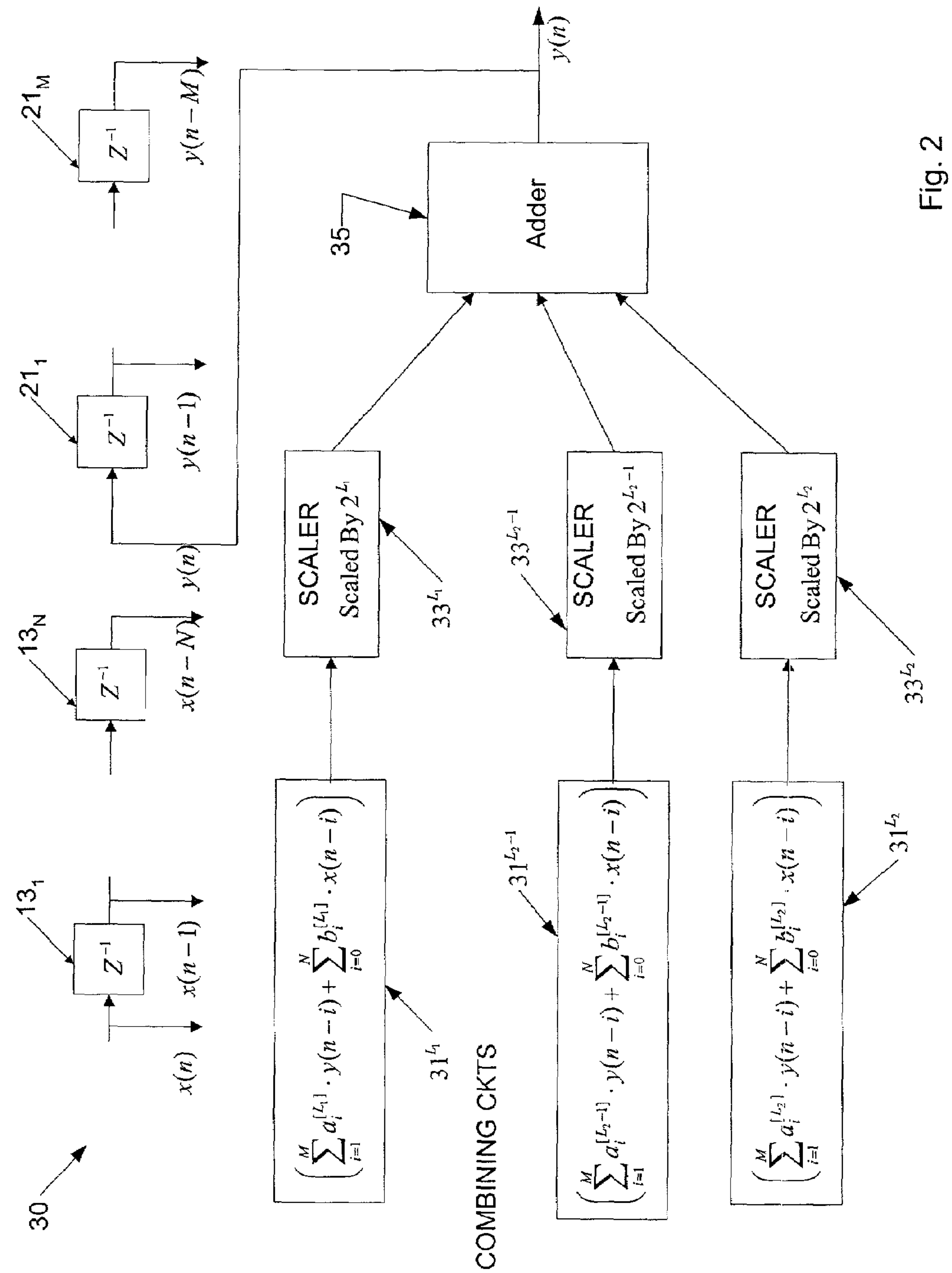
FIG. 2 is a simplified functional block diagram of an embodiment of a digital filter.

In a general form, the inventive digital filter can be implemented in hardware or as a process flow of a digital signal processor (DSP) as shown in FIG. 2. In a DSP, each functional block comprises one or more processing steps to implement the illustrated function. For discussion purposes, however, assume that the functions shown in FIG. 2 are implemented in hardware. As shown in the drawing, the digital filter 30 includes a delay line comprised on N delay elements $\mathbf{13}_1$ to $\mathbf{13}_N$. The delay elements $\mathbf{13}_1$ to $\mathbf{13}_N$ provide delayed samples of the input signal x(n), as in the filter of FIG. 1. The digital filter 30 also includes a delay line comprised on M (typically N+1) delay elements $\mathbf{21}_1$ to $\mathbf{21}_M$, which provide delayed samples of the output signal y(n), as in the filter of FIG. 1.

The digital filter 30 includes a number of sample-value combining circuits 31 and a corresponding number of shift or scaler circuits 33. Specifically, the digital filter includes combining circuits $\mathbf{31}^{L_1}$ to $\mathbf{31}^{L_2}$. These combining circuits receive appropriate ones of the samples from the input signal x(n), the taps between the delay elements $\mathbf{13}_1$ to $\mathbf{13}_N$ and/or the taps between the delay elements $\mathbf{21}_1$ to $\mathbf{21}_M$, to provide each predetermined set of values for the desired fixed point mathematical combination function.

It should be noted, however, that the values for the coefficients a and b are binary values 1 and 0. As such, wherever a coefficient is binary 0, in one of the desired filter function sequences, the particular combining circuit 31 does not need to receive the particular sample from the input tapped delay line or the output tapped delay line. Where the coefficient value is a 1, identity, the particular combining circuit 31 simply receives the appropriate sample from input tapped delay line or the output tapped delay line and adds the value to the others in the particular string. Hence, the implementation of each of the circuits 31 requires only appropriate connection to the input signal x(n), the taps between the delay elements $\mathbf{13}_1$ to $\mathbf{13}_N$ and/or the taps between the delay elements $\mathbf{21}_1$ to $\mathbf{21}_M$, and a sufficient number/configuration of adders to sum the particular digital values.

Each of the combining circuits $\mathbf{31}^{L_1}$ to $\mathbf{31}^{L_2}$ outputs the resultant computed value (interim total), as an input sample value for processing by a corresponding one of the scalers $\mathbf{33}^{L_1}$ to $\mathbf{33}^{L_2}$. For each respective integer value $L_1$ to $L_2$, the respective one of the scaler circuits $\mathbf{33}^{L_1}$ to $\mathbf{33}^{L_2}$ shifts the binary value from the corresponding one of the combining circuits $\mathbf{31}^{L_1}$ to $\mathbf{31}^{L_2}$ by a number of bits or places equal to the respective value of L, to effectively multiply the respective input by the base value (2 in a binary system) raised to the corresponding powers in the range $L_1$ to $L_2$. The scalers 31 may be implemented by shift registers or other simpler digital shift circuits.

The scalers $\mathbf{33}^{L_1}$ to $\mathbf{33}^{L_2}$ supply the scaled values to an adder 35, which totals all of the scaled values to form the output signal y(n). During each clock cycle, the output value y(n) is a computed sample value derived by the computations performed by the digital filter circuit 30, in accordance with the desired filter function and implemented in accordance with the the illustrated example.

Those skilled in the art will recognize that the digital filter processing, implemented in hardware in FIG. 2, may easily be implemented in the process flow of a digital signal processor, for example by appropriate programming of a digital signal processor.

Actual application of the inventive filter, for example, in a spread spectrum receiver may be used to approximate a filter function (Equation (1)) that otherwise might require 24 or even 60 multiplications. To appreciate the application and advantages of the inventive concept, however, it may be helpful to consider a very simple example. For that purpose, consider the following filter function.

$$y(n)=0.875\cdot y(n-1)+0.375\cdot x(n)$$

Figure 3:
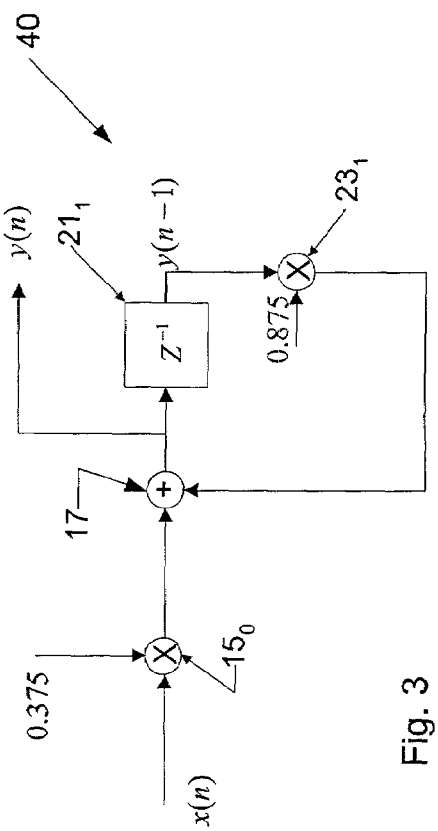
FIG. 3 is functional block diagram of an example of the processing of a simple digital filter function.

FIG. 3 shows the normal process flow for this simple filter function, if implemented in a manner similar to the circuit of FIG. 1. As shown, the hardware 40 for implementing this simple filter function supplies the current value x(n) sampled from the input signal to a first fixed-point multiplier $\mathbf{15}_0$. The multiplier $\mathbf{15}_0$ multiplies the current value x(n) by the binary representation of the coefficient value 0.375. The multiplier $\mathbf{15}_0$ supplies the product of this multiplication to one input of an adder 17.

The output of the adder 17 represents the output y(n) of the filter circuit 40. The output y(n) of the filter circuit 40 is applied to a single delay element $\mathbf{21}_1$, which is part of a feedback loop. The delay element $\mathbf{21}_1$, provides a delay of one cycle, hence the current output of the delay element $\mathbf{21}_1$ is the filter output value from the immediately preceding clock cycle, that is to say the value y(n−1). The delay element $\mathbf{21}_1$ supplies the value y(n−1) to a multiplier $\mathbf{23}_1$, which multiplies the delayed output value y(n−1) by the binary representation of the coefficient value 0.875. The multiplier $\mathbf{23}_1$ supplies the product of this second multiplication to the second input of the adder 17, for addition to the current product of the sample x(n) multiplied by the coefficient 0.375 produced by the multiplier $\mathbf{15}_0$. As noted, the sum of these two products accumulated by the adder 17 represents the current output value y(n).

Although the circuit 40 of FIG. 3 appears relatively simple, when illustrated in block diagram form, an actual implementation on an electronic circuit chip is actually relatively complex. Even this simple filter implementation requires two fixed-point numerical multipliers $\mathbf{15}_0$ and $\mathbf{23}_1$, for multiplying sample values. The more bits included in the sample values, the larger and more complex these multipliers become. The multipliers require a large number of gates, occupy considerable chip-space and consume a large amount of power.

The multiplications are implemented by a series of adders and scalers. In this example, because $$0.875=1\cdot 2^{-1}+1\cdot 2^{-2}+1\cdot 2^{-3}$$

we can write 0.875·y(n−1) in the form $$y(n-1)\cdot 2^{-1}+y(n-1)\cdot 2^{-2}+y(n-1)\cdot 2^{-3}$$

Therefore, 2 adders are needed. Similarly, because $$0.375=0\cdot 2^{-1}+1\cdot 2^{-2}+1\cdot 2^{-3}$$

$$0.375\cdot x(n)=x(n)\cdot 2^{-2}+x(n)\cdot 2^{-3}$$

1 adder is needed.

There is 1 more adder used to combine 0.875·y(n−1) +0.375·x(n), and therefore by a direct method, there are 4 adders needed to implement $$y(n)=0.875\cdot y(n-1)+0.375\cdot x(n)$$

In accordance with the present concepts, it is possible to replace the fixed-point multiplications of sample values with simple connections corresponding to binary (1 or 0) coefficient values in combination with appropriate scaling operations. Consider now an application of the technique to the same filter function. First, the coefficients 0.875 and 0.375, from the simple example can be expressed in binary form as follows.

$$0.875=1\cdot 2^{-1}+1\cdot 2^{-2}+1\cdot 2^{-3}$$

$$0.375=0\cdot 2^{-1}+1\cdot 2^{-2}+1\cdot 2^{-3}$$

By substituting these binary values for the coefficients in the filter function $$y(n)=0.875\cdot y(n-1)+0.375\cdot x(n)$$

the expression for the filter function becomes $$y(n)=(1\cdot 2^{-1}+1\cdot 2^{-2}+1\cdot 2^{-3})\cdot y(n-1)+(0\cdot 2^{-1}+1\cdot 2^{-2}+1\cdot 2^{-3})\cdot x(n).$$

It is then possible to regroup the sample values based on the common scaler functions (powers of 2). This converts the filter function to the expression shown below.

$$y(n)=(1\cdot y(n-1)+0\cdot x(n))\cdot 2^{-1}+(1\cdot y(n-1)+1\cdot x(n))\cdot 2^{-2}+(1\cdot y(n-1)+1\cdot x(n))\cdot 2^{-3}$$

The actual implementation requires three scaling operations ($2^{-1}$, $2^{-2}$ and $2^{-3}$) and a corresponding frontend combining circuit to supply the appropriate combinations of samples for the respective scalings. Where the binary coefficients are 0, however, there is no need to process the sample values, and it is possible to eliminate any x or y values multiplied by 0 from the expression. Also, the applications of the 1 coefficients represent multiplications by identity and reduce to the respective sample values for y or x, which can be implemented by simply connecting the appropriate sample values through the combining circuit(s). As a result, the pervious version of the exemplary filter function can be simplified to:

$$y(n)=y(n-1)\cdot 2^{-1}+(y(n-1)+x(n))\cdot 2^{-2}+(y(n-1)+x(n))\cdot 2^{-3}$$

Figure 4:
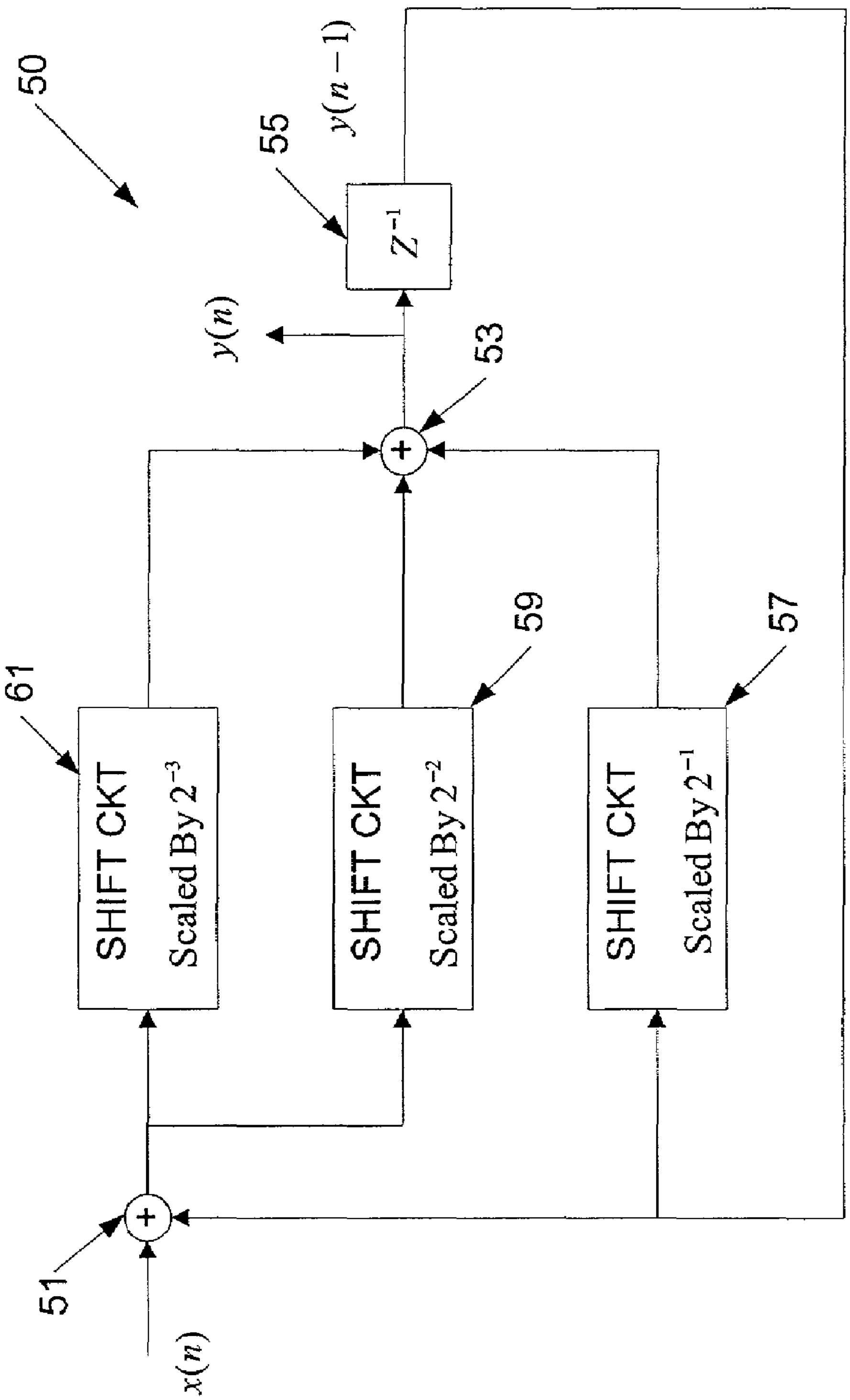
FIG. 4 is a simplified functional block diagram of an embodiment of a digital filter providing the same filter transfer function as FIG. 3 but implemented in accordance with an embodiment of the present teachings.

There is 1 adder needed for y(n−1)+x(n); and 2 adders needed to combine $y(n-1)\cdot 2^{-1}$, $(y(n-1)+x(n))\cdot 2^{-2}$ and $(y(n-1)+x(n))\cdot 2^{-3}$ together. Therefore, 3 adders are needed to implement $y(n-1)\cdot 2^{-1}+(y(n-1)+x(n))\cdot 2^{-2}+(y(n-1)+x(n))\cdot 2^{-3}$. We save 1 adder compared with the direct method. This is a very simple example. In many real digital filters, many more bits and many more multipliers would be required, and therefore the savings on hardware due to use of the invention present teachings is huge. This inventive filter function can be implemented in a digital signal processor or in hardware. FIG. 4 shows a functional representation of the inventive filter processing. These functions may be implemented as process steps performed in the digital signal processor. For discussion of a presently preferred embodiment, the block diagram represents a hardware implementation 50 of this simple digital filter function in accordance with an example.

As shown, the digital filter 50 comprises only two adders 51, 53, one delay element 55 and three scalers 57, 59 and 61 implemented by shift circuits such as shift registers. The first adder 51 forms the sum of the input value x(n) and the feedback of the delayed output value y(n−1) from the delay element 55.

The first circuit 57 shifts the input applied thereto one binary place, to scale that input value by $2^{-1}$. The second circuit 59 shifts the input applied thereto two binary places, to scale that input value by $2^{-2}$. The third circuit 61 shifts the input applied thereto three binary places, to scale that input value by $2^{-3}$. The input connections to the shift circuits and the adder 51 perform the functions of the combiner circuits 31 in the embodiment of FIG. 2 to supply the appropriate combined values as inputs to the shift circuit type scalers 57, 59 and 61.

In this example, the first shift circuit 57 receives the delayed output value of the previous clock cycle y(n−1) and shifts that sample value one binary place, to scale that value by $2^{-1}$. The second shift circuit 59 receives the numerical value that is the sum of the delayed output value of the previous clock cycle y(n−1) and the input sample x(n) for the current clock cycle, and the second shift circuit 59 shifts that sum two binary places, to scale that total numerical value by $2^{-2}$. In this example, the third shift circuit 61 receives the numerical value that is the sum of the delayed output value of the previous clock cycle y(n−1) and the input sample x(n) for the current clock cycle, and the third shift circuit 61 shifts that total numerical value three binary places, to scale that value by $2^{-3}$.

The second adder 53 sums the scaled outputs of the three shift circuits 57, 59 and 61 to form the overall filter output value y(n), which is also input to the delay device 55 for use in the feedback processing during the next clock cycle.

The implementation shown in FIG. 4 has been described as a device constructed of appropriate circuit elements. Those skilled in the art will recognize, however, that it is a simple matter to implement the illustrated processing functions as a series of process steps programmed into a digital signal processor.

Figure 5:
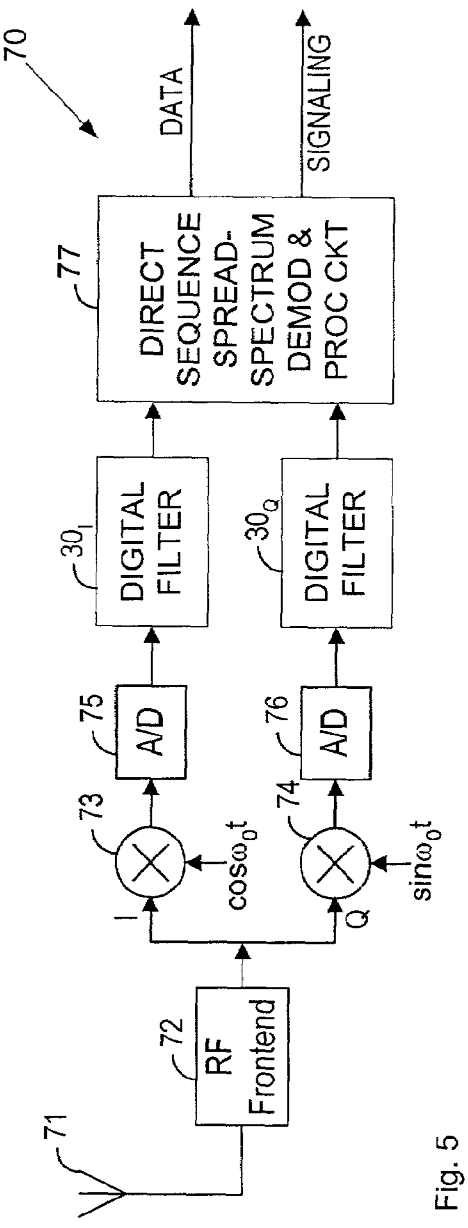
FIG. 5 is simplified functional block diagram of a wireless receiver incorporating the inventive digital filter.

The digital filter of the present invention finds particularly advantageous application in digital wireless receiver devices, for example in spread-spectrum receivers of portable wireless terminals. FIG. 5 is a simplified block diagram of such a receiver.

As shown, the receiver 70 includes an antenna 71 for receiving a spread-spectrum signal transmitted over the air-link. An RF frontend system 72 provides low noise amplification and automatic gain control (AGC) processing of the analog signal from the antenna 71.

The RF frontend system 72 supplies the channel signal to two translating devices 73 and 74. A local oscillator generates proper carrier-frequency signals and supplies a $\cos(\omega_o t)$ signal to the device 73 and supplies a $\sin(\omega_o t)$ signal to the device 74. The translating device 73 multiplies the amplified over-the-air channel signal by the $\cos(\omega_o t)$ signal; and the translating device 74 multiplies the amplified over-the-air channel signal by the $\sin(\omega_o t)$ signal. The translating devices 73 and 74 thereby translate the received multi-channel spread-spectrum signal from the carrier frequency to in-phase (I) and quadrature (Q) signals at a processing frequency.

The translating device 73 downconverts the in-phase (I) spread-spectrun signal to the processing frequency and supplies the converted signal to an analog to digital (A/D) converter 75. Similarly, the translating device 74 downconverts the quadrature (Q) spread-spectrum signal to the processing frequency and supplies the converted signal to an analog to digital (A/D) converter 76. Each of the digital output signals is applied to a digital filter $\mathbf{30}_I$ or $\mathbf{30}_Q$. Each digital filter 30 utilizes the inventive digital filtering technique, in essentially the manner described above relative to FIG. 2, that is to say implemented without numerical value mutiplications. The filters $\mathbf{30}_I$ or $\mathbf{30}_Q$ may implement substantially the same filter functions or somewhat different filter functions, as appropriate to process the in-phase (I) and quadrature (Q) spread-spectrum signals.

The filters $\mathbf{30}_I$ and $\mathbf{30}_Q$ supply filtered output streams of digitized values, representing the received in-phase (I) and quadrature (Q) signals, to further circuitry represented as a direct sequence spread spectrum demodulator and processing circuit 77. The circuit 77 processes the I and Q data streams to recognize code sequences and recover received data and signaling information. The circuit 77, for example, may include matched filter banks for code detection and a processor, which performs interference cancellation, AFC and phase rotation. Such an implementation of the circuit 77 would further include a Rake combiner and decision/demapper circuit 51, to recover and remap the chip sequence signals from the I and Q channels to the original data sequences. The data sequences for the I and Q channels also are multiplexed together to form an output data stream, which is applied to a deinterleaver and then to a decoder, which performs forward error correction. The data and/or signaling information recovered in this manner may be specifically addressed to the particularly receiver 70 or broadcast to a plurality of such receivers.

A more detailed description of a direct sequence communication system, incorporating a receiver of the type shown in FIG. 5, may be found in commonly assigned U.S. patent application Ser. No. 09/662,148, filed Sep. 15, 2000. The inventive digital filter may also find application in a wide range other spread-spectrum receivers, such as that used in the common packet channel (CPCH) system disclosed in U.S. Pat. No. 6,169,759 to Kanterakis et al. or in the system disclosed in commonly assigned U.S. patent application Ser. No. 09/570,393 filed May 12, 2000. The disclosures of the commonly assigned applications and the 6,169,759 Patent are incorporated entirely herein by reference.

Those skilled in the art will recognize that the present invention has a broad range of applications, for example, in digital filter processing applications for various other wired and wireless telecommunications receivers and for many other digital signal processing purposes. The invention also admits of a wide range of modifications without departure from the inventive concepts. For example, the embodiments described above utilized binary or base 2, however, the invention may be implemented in base 4 or in other numerical systems.

While the foregoing has described what are considered to be the best mode and/or other preferred embodiments of the invention, it is understood that various modifications may be made therein and that the invention may be implemented in various forms and embodiments, and that it may be applied in numerous applications, only some of which have been described herein. It is intended by the following claims to claim any and all modifications and variations that fall within the true scope of the inventive concepts.

What is claimed is:

1. A method of digital filtering of a digitized input stream in accordance with a predetermined filter function approximating a sum of products of a series of one or more first coefficient values and a series of one or more delayed samples from a digital output stream added together with a sum of products of a series of one or more second coefficient values and a series comprising one or more samples from the digital input stream, the digital filtering method comprising the steps of:

combining predetermined sets of one or more samples from the digital input stream and one or more samples from the digital output stream, to form a plurality of respective numeric input values;

scaling each of the plurality of respective numeric input values by a different power of a base numeric value for the digital filtering, to form a respective one of a plurality of scaled values; and adding the scaled values together to form the digital output stream in accordance with the predetermined filter function.

2. A method as in claim 1, wherein the base numeric value is 2, and the step of scaling comprises shifting each respective numeric input value by a different number of bit positions, so as to scale the respective numeric input value by a different power of 2.

3. A digital filter for processing samples of a digital input stream in accordance with a predetermined filter function, comprising:

means for combining predetermined sets of one or more samples from the digital input stream and one or more samples from a digital output stream of the filter, to form a plurality of respective numeric input values;

means for scaling each of the plurality of respective numeric input values by a different power of a base numeric value used to implement the digital filter, to form a respective one of a plurality of scaled values; and means for adding the scaled values together to form the digital output stream in accordance with the predetermined filter function.

4. A digital filter as in claim 3, wherein the means for combining, the means for scaling, and the means for adding are implemented in a digital signal processor.

5. A digital filter for processing samples of a digital input stream in accordance with a predetermined filter function, comprising:

a plurality of scalers, each for scaling a respective input sample value by a different power of a base numeric value to form a respective scaled value;

one or more combining circuits, for combining predetermined sets of one or more samples from the digital input stream with one or more samples from a digital output stream of the digital filter, to form respective input sample values for input to the scalers; and an adder coupled to outputs of the scalers for totaling the respective scaled values, to form the digital output stream of the digital filter in accordance with the predetermined filter function.

6. A digital filter for processing samples of a digital input stream in accordance with a predetermined filter function, comprising:

a plurality of scalers, each for scaling a respective input sample value by a different power of a base numeric value to form a respective scaled value;

one or more combining circuits, for combining predetermined sets of one or more samples from the digital input stream with one or more samples from a digital output stream of the digital filter, to form respective input sample values for input to the scalers;

an adder coupled to outputs of the scalers for totaling the respective scaled values, to form the digital output stream of the digital filter in accordance with the predetermined filter function;

a first multi-tap delay line, coupled to receive the digital input stream, for supplying predetermined samples from the digital input stream to the one or more combining circuits; and a second multi-tap delay line, coupled to an output of the adder, for supplying predetermined samples from the digital output stream to the one or more combining circuits.

7. A digital filter as in claim 5, wherein the base numeric value is 2, and each of the scalers comprises a shift circuit, for shifting the respective input sample value by a specific number of bits, so as to scale the respective input sample value by a different power of 2.

8. A digital filter for processing samples of a digital input stream without numeric multiplication, the digital filter comprising:

a plurality of scalers, each for scaling a respective input sample value by a different power of a base numeric value, to form a respective scaled value;

a plurality of combining circuits, each combining circuit for combining a predetermined set of samples from the digital input stream and samples from a digital output stream of the digital filter, to form a respective input sample value for input to one of the scalers; and an adder, coupled to outputs of the scalers, for totaling the respective scaled values, to form the digital output stream of the digital filter without numeric multiplication, wherein the digital filter exhibits a predetermined filter function approximating: a sum of products of a series of one or more first coefficient values and a series of one or more one or more samples from the digital output stream, added together with a sum of products of a series of one or more second coefficient values and a series comprising a one or more samples from the digital input stream.

9. A digital filter as in claim 8, further comprising:

a first multi-tap delay line, coupled to receive the digital input stream, for supplying samples from the digital input stream to the combining circuits; and a second multi-tap delay line, coupled to receive the digital output stream from the adder, for supplying samples from the digital output stream to the combining circuits.

10. A digital filter as in claim 8, wherein the base numeric value is 2, and each of the scalers comprises a shifter for shifting the respective input sample by a respective number of bit positions, so as to scale the respective input sample value by a different power of 2.

11. A method of digital filtering of a digitized input signal in accordance with a predetermined filter function comprising $$y(n) = \sum_{i=1}^{M} a_i \cdot y(n-i) + \sum_{i=0}^{N} b_i \cdot x(n-i)$$

where $a_i$ and $b_i$ are numerical coefficient values, x is the digital input and y is the digital output, n is an integer, the digital filtering method comprising:

converting each the numerical coefficient values of $a_i$ and $b_i$ into the form of:

$$a_l = \sum_{j=L_1}^{L_2} a_l^{[j]} \cdot 2^j$$

$$b_l = \sum_{j=L_1}^{L_2} b_l^{[j]} \cdot 2^j$$

wherein $L_1$ and $L_2$ are two integers, such that:

$$2^{L_2} \geqq a_i \geqq 2^{L_1}, \text{ for } i=1, \ldots, M$$

$$2^{L_2} \geqq b_i \geqq 2^{L_1}, \text{ for } i=1, \ldots, N$$

and the converted coefficients $a_i^{[j]}$ and $b_i^{[j]}$ have binary values of 1 or 0;

sequentially receiving and delaying a plurality N of most recent samples of the input signal x; and scaling combinations of specific ones of the N received and delayed samples of the input signal and specific samples from a predetermined number M of delayed output signals, by respective scaler values and combining respective scaled values so as to produce output signals by approximating the digital filter function y(n) in the following form:

$$y(n) = \sum_{j=L_1}^{L_2} \left( \sum_{i=1}^{M} a_i^{(j)} \cdot y(n-i) + \sum_{i=0}^{N} b_i^{[j]} \cdot x(n-i) \right) \cdot 2^j.$$

12. A wireless spread-spectrum receiver, comprising:

an antenna for receiving a wireless spread-spectrum signal;

an analog to digital converter coupled to the antenna for converting the received wireless spread-spectrum signal to a digital input stream;

a digital filter for processing samples of the digital input stream in accordance with a predetermined filter function, the digital filter comprising:

(a) means for combining predetermined sets of one or more samples from the digital input stream and one or more samples from a digital output stream of the filter, to form a plurality of respective numeric input values;

(b) means for scaling each of the plurality of respective numeric input values by a different power of a base numeric value for the digital filter, to form a respective one of a plurality of scaled values; and (c) means for adding the scaled values together to form the digital output stream in accordance with the predetermined filter function; and a direct sequence spread spectrum demodulator coupled to the digital filter, for processing the digital output stream to recover data or signaling information.

* * * * *